(12) United States Patent
Farzan et al.

(10) Patent No.: US 7,969,697 B2
(45) Date of Patent: Jun. 28, 2011

(54) LOW-VOLTAGE CMOS SPACE-EFFICIENT 15 KV ESD PROTECTION FOR COMMON-MODE HIGH-VOLTAGE RECEIVERS

(75) Inventors: Bahman Farzan, Mountain View, CA (US); Hung Pham Le, San Jose, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 12/107,624

(22) Filed: Apr. 22, 2008

(65) Prior Publication Data

US 2009/0262474 A1   Oct. 22, 2009

(51) Int. Cl.
 *H02H 9/00* (2006.01)
(52) U.S. Cl. ......................................................... 361/56
(58) Field of Classification Search .................. 257/173, 257/362; 313/533; 438/133; 361/56, 111
 See application file for complete search history.

(56) References Cited

U.S. PATENT DOCUMENTS

| | | | | |
|---|---|---|---|---|
| 4,896,028 A | * | 1/1990 | Kushima | 235/492 |
| 5,274,524 A | * | 12/1993 | Pezzani et al. | 361/56 |
| 5,654,862 A | | 8/1997 | Worley et al. | |
| 5,748,425 A | * | 5/1998 | Gutsch et al. | 361/56 |
| 5,825,600 A | * | 10/1998 | Watt | 361/56 |
| 5,889,644 A | * | 3/1999 | Schoenfeld et al. | 361/56 |
| 5,898,193 A | | 4/1999 | Ham | |
| 5,907,464 A | * | 5/1999 | Maloney et al. | 361/111 |
| 5,986,862 A | * | 11/1999 | Kim | 361/56 |
| 6,258,634 B1 | | 7/2001 | Wang et al. | |
| 6,768,617 B2 | * | 7/2004 | Marr | 361/56 |
| 6,770,918 B2 | | 8/2004 | Russ et al. | |
| 7,285,827 B1 | * | 10/2007 | He et al. | 257/355 |
| 7,570,467 B2 | * | 8/2009 | Watanabe et al. | 361/56 |
| 2003/0102923 A1 | * | 6/2003 | Vickram et al. | 330/298 |
| 2005/0121725 A1 | * | 6/2005 | Ando et al. | 257/356 |
| 2006/0289937 A1 | | 12/2006 | Li et al. | |
| 2007/0034897 A1 | | 2/2007 | Kim | |
| 2009/0040664 A1 | * | 2/2009 | Higuchi et al. | 361/19 |

OTHER PUBLICATIONS

International Search Report of the International Searching Authority for Application No. PCT/US2009/041246, mailed on Jun. 11, 2009, 2 pages.
Written Opinion of the International Searching Authority for Application No. PCT/US2009/041246, mailed Jun. 11, 2009, 4 pages.

* cited by examiner

*Primary Examiner* — Jared J Fureman
*Assistant Examiner* — Angela Brooks
(74) *Attorney, Agent, or Firm* — Kilpatrick Townsend & Stockton LLP; Ardeshir Tabibi

(57) ABSTRACT

An electrostatic discharge protection device is disposed between true-complement input pins of a differential signal pair and a ground node. A common node couples the three diode stacks together. A first and a second diode stack each connect to one of the differential signal pair input pins. The third diode stack couples to the ground node. Each of the diode stacks is fabricated by a pair of high concentration p-type contact dopant regions within a low concentration n-well region. Each of the p-type contact dopant regions is configured to form back-to-back diodes connected in series with cathodes in common. In protecting common mode receivers, current from an ESD event is channeled to ground rather than to the complementary receiver node. The diode stacks are capable of withstanding a 15 kV incident and save up to 25% in area compared to a fully parallel configuration for differential signal pairs.

1 Claim, 3 Drawing Sheets

LOW-VOLTAGE CMOS SPACE-EFFICIENT 15 KV ESD PROTECTION FOR COMMON-MODE HIGH-VOLTAGE RECEIVERS

BACKGROUND OF THE INVENTION

The present invention generally relates to semiconductor input protection devices. More specifically, the invention relates to electrostatic discharge protection of input terminals of a semiconductor device.

As semiconductor technologies continue to decrease in size between technological generations, electrical issues due to high-voltage events become more significant. Small device feature sizes mean that problems such as meeting required spacing for device isolation and the effects of parasitic lateral bipolar devices within diffused wells become more of a concern. Low doping levels in wells and epitaxial layers commensurate with small feature size technologies are beneficial for low source-drain capacitance but aggravate the ability to withstand overvoltage events. Both the effects of scaling and certain artifacts of processes optimized for small feature sizes affect devices designed to protect against high-voltage events.

The use of typical CMOS field effect transistors (FETs) in input protection devices has many drawbacks. These devices are subject to degradation or complete breakdown in the presence of the high current density and electric fields encountered during ESD events. Additionally, use of typical CMOS FET devices introduces parasitic structures that in turn provide unwanted current paths. These unwanted current paths may short out the entire device (a phenomenon known as latchup). Parasitic pnpn and bipolar devices are typically formed as the result of CMOS processing steps and applied voltages.

One drawback of a parasitic pnpn device is that the structure has multiple stable current conduction states. For relatively low voltages, a stable high impedance region of operation exists and is commonly known as a blocking state (an OFF state). The blocking state is characterized by a high impedance across the pnpn structure. As the voltage across the pnpn structure increases a voltage referred to as a snapback voltage ($V_s$) is reached. At the snapback voltage a transition to a second state, known as the latched state (or ON state) is possible. The latched state is characterized by a low impedance and causes a highly conductive path to form. This paths may conduct enough current to disable or destroy a semiconductor device. Once triggered in semiconductor structures, the latched state may not be switched off without removing the source of power to the device.

In conventional integrated circuits input protection diodes 100 are typically arranged as shown in FIGS. 1A and 1B. Generally this type of arrangement of diodes avoids formation of the parasitic devices mentioned above. Input terminals V+ and V− represent connections for applying a differential signal pair. Input terminal V+ connects to diode stack 105. Diode stack 105 includes two diodes connected back-to-back at their respective cathode terminals. Diode stack 115 connects in series with diode stack 105. Diode stack 115 includes diodes connected back-to-back like the arrangement of diode stack 105. Diode stack 115 is also connected to ground. Referring to FIG. 1B, input terminal V− and a second ground are applied between diode stacks 110 and 120.

Typically, electrostatic discharge (ESD) protection devices have scaled in size in proportion to a magnitude of protection voltage desired. In addition to size constraints due to scaling, a dedicated discharge path to ground for individual input pins has been used. A dedicated discharge path per input pin further exacerbates the size problem coming from the scaling requirement since the entirety of each input pin protection device scales by the same factor. Additionally, for ESD protection in semiconductor circuits, where protection capabilities on the order of, for example, 15 kV are required, conventional protection devices, such as CMOS transistors, may not be effective and may further damage the protection devices.

BRIEF SUMMARY OF THE INVENTION

Among other advantages and features, the space-efficient ESD protection circuit provides a high level of protection against incident high-voltage events, according to one embodiment. Incident voltages of, for example, 15 kV are sustainable by the device.

In accordance with one embodiment, a first and a second input diode stack each connect to a respective one of a differential pair of signal input pins and to a common node. A common diode stack couples between ground and to the first and the second input diode stack at the common node. All three of the diode stacks include a pair of diodes coupled back-to-back. The series connection is made at the respective cathode terminals of each diode stack.

DETAILED DESCRIPTION OF THE INVENTION

Figures 1A, 1B:
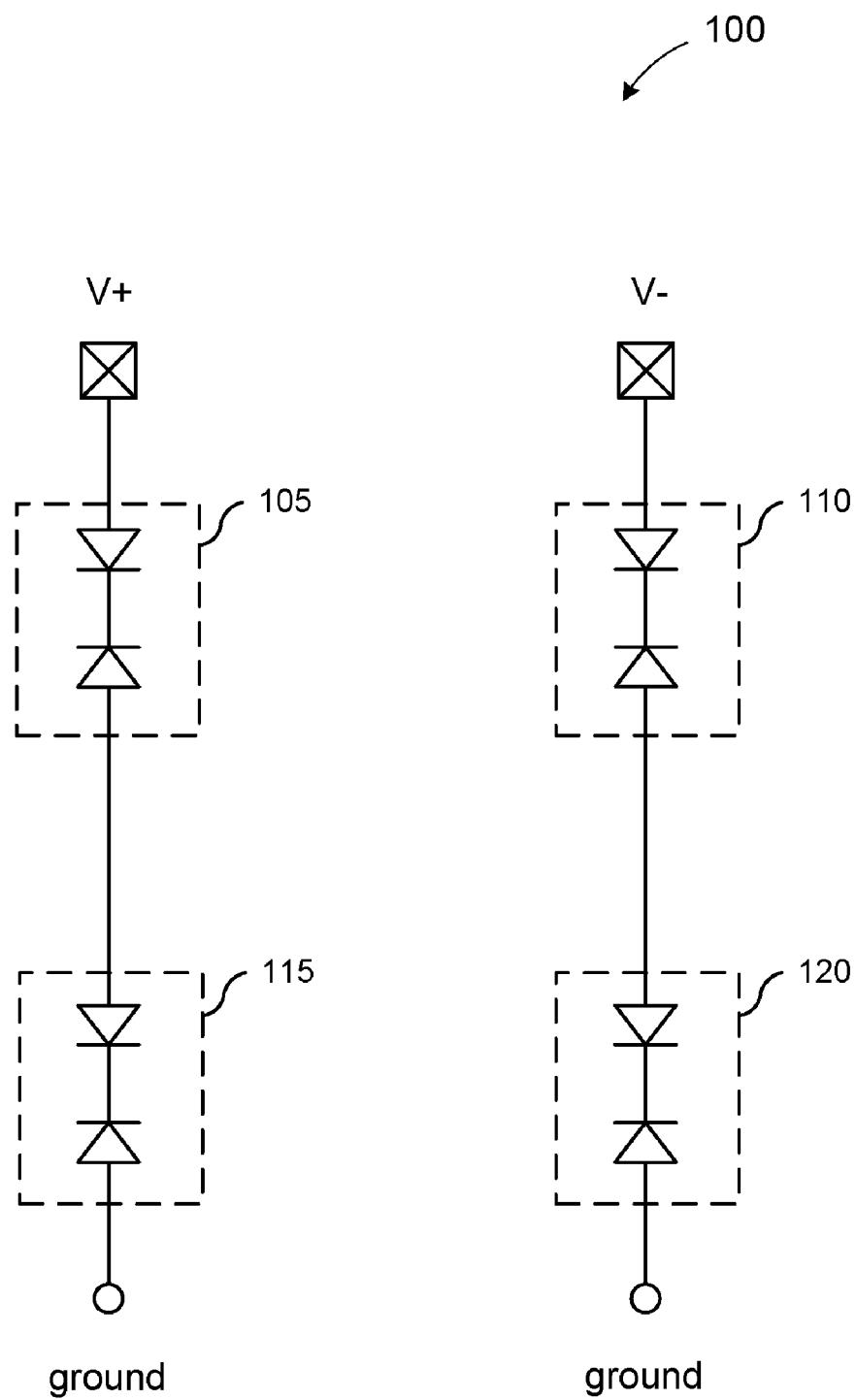
FIGS. 1A and 1B are schematic diagrams of ESD input protection devices, as known in the prior art.
Figure 2:
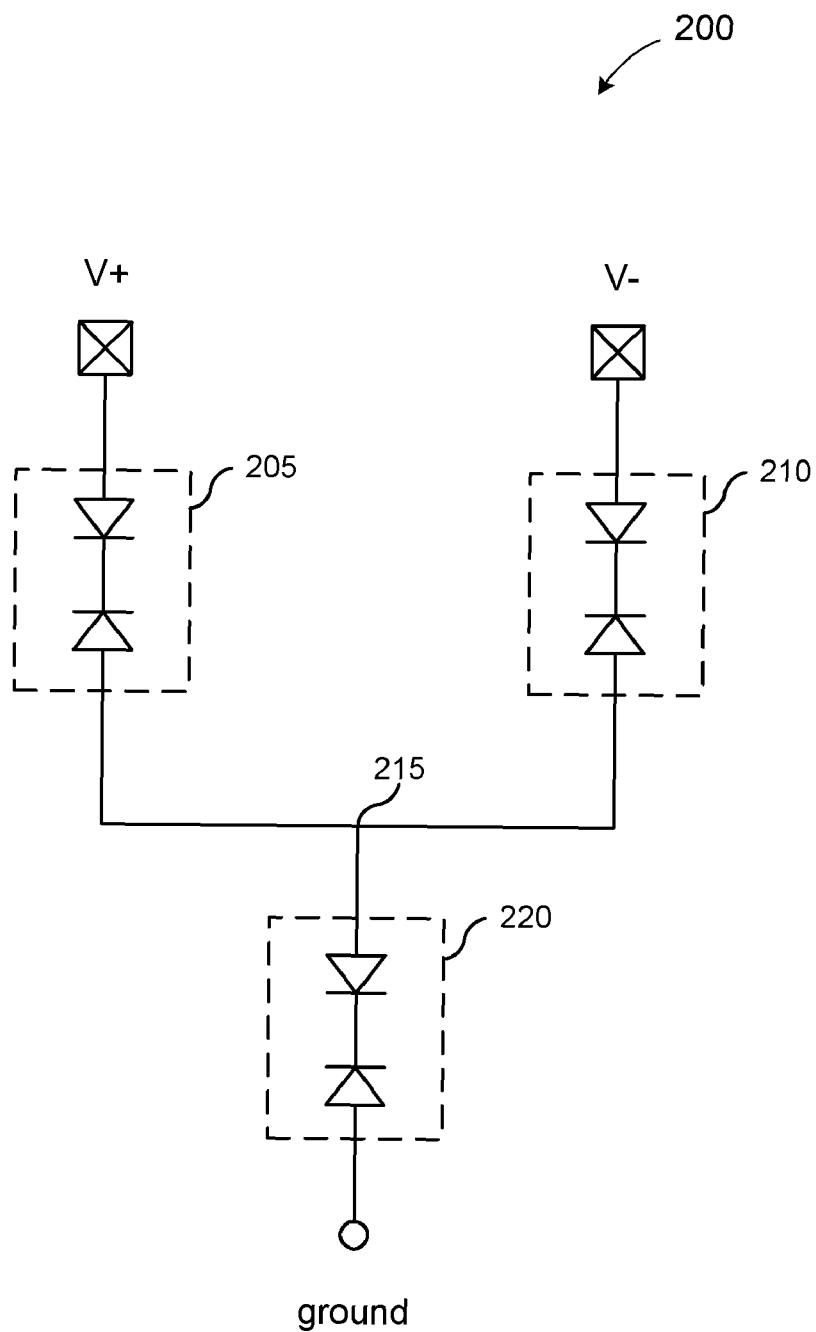
FIG. 2 is a schematic diagram of an ESD input protection device according to an exemplary embodiment of the present invention.

FIG. 2 is a schematic diagram of an ESD input protection device 200, according to an exemplary embodiment of the present invention. A multitude of diodes, disposed between input terminals V+, V−, and ground, form the ESD protection device 200. Diode stack 205 is coupled to input terminal V+ and common node 215. Diode stack 210 is coupled between input terminal V− and common node 215. Diode stack 220 is coupled between common node 215 and ground. All diode stacks 205, 210, and 220 include back-to-back diodes coupled in series at their respective cathode terminals. The various nodes and terminals are coupled to one another using one or more metallization layers.

Figure 3:
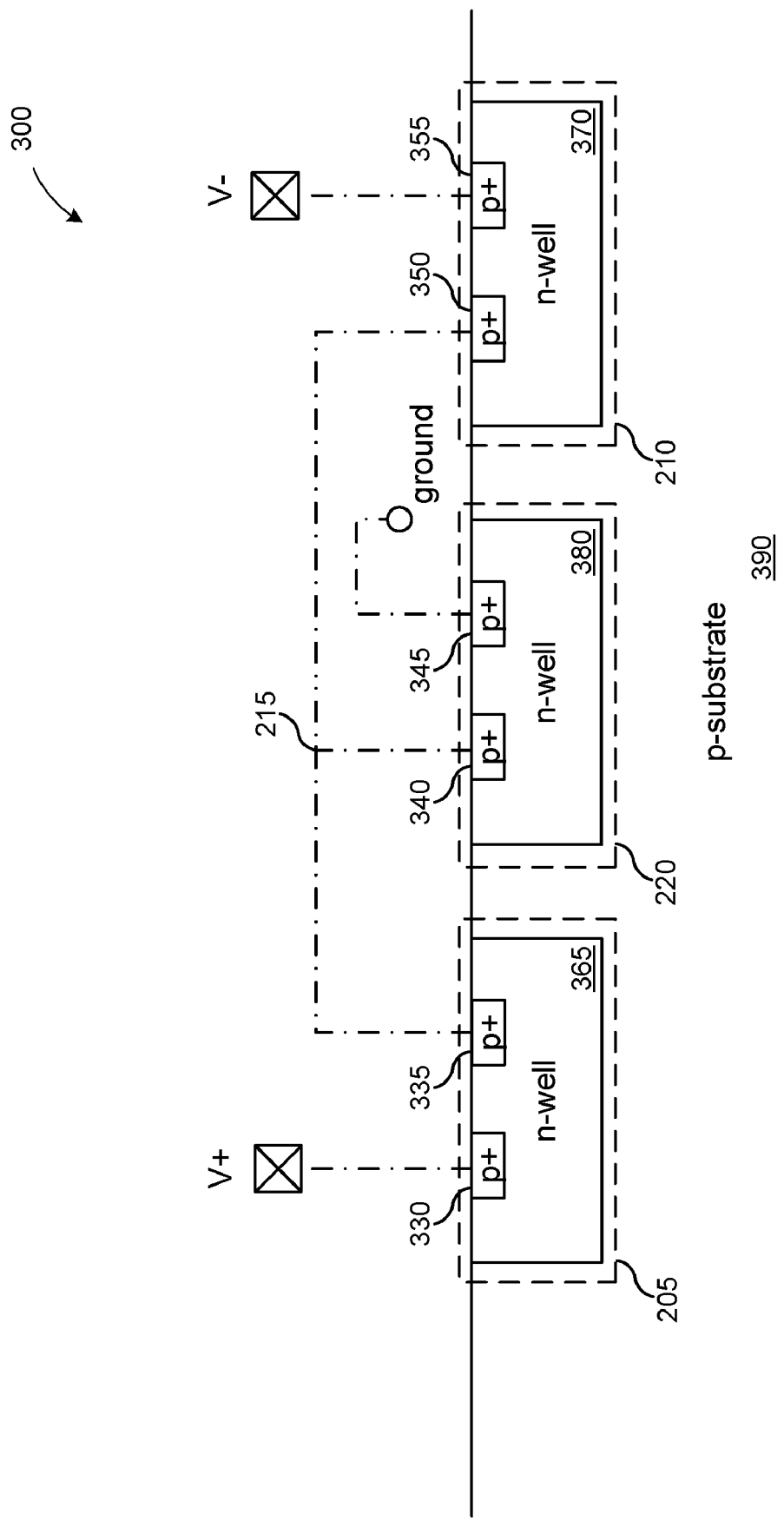
FIG. 3 is a cross-sectional diagram of a semiconductor substrate according to an exemplary embodiment of the present invention.

FIG. 3 is a cross-sectional diagram of a semiconductor substrate in which input protection device 200 is formed, according to an exemplary embodiment of the present invention. Substrate 390 is a lightly doped p-type substrate which may be, for example, an epitaxial layer. The diode stacks 205, 220, and 210 are formed in n-well regions 365, 380, and 370, respectively. Formed within each n-well region, are a pair of p+ regions that form the anode terminals of the diodes formed in that n-well.

Input terminal V+ is coupled to the p+ region 330 that is formed within n-well 365. Common node 215 is coupled to p+ regions 335, 340 and 350. N-well regions 365, 380, and 370 form the cathode terminals of diode stacks 205, 220, and 210 respectively. P+ region pairs 330 and 335, 340 and 345, and 350 and 355 form the anode terminals of the diodes disposed in diode stacks 205, 220, and 210 respectively.

An input protection device, in accordance with the present invention, may be used to provide protection in both differential and common modes of operation. As an electrostatic voltage is applied to one of the receiver inputs, the applied voltage and resulting current is dissipated between that input to ground. The ground node, having a potential of about 0 V, ensures that the common diode stack 220 is used in conjunction with one of the other input diode stacks 205, 210. With the ESD voltage drop across an input to ground, each diode stack involved drops about half the ESD voltage. In each diode stack, a first diode is forward biased and a second diode is reversed biased. The forward biased diode conducts to provide a discharge path to ground for a positive-going ESD event. The remaining diode in each stack is reversed biased. For example, p+ regions 335, 345, and 355 and their respective well regions are reverse biased during an ESD event. The reverse biased junctions will conduct after a break down of the junction occurs. Either Zener breakdown or avalanche triggering from the high electric fields operating on a reverse leakage current across the junction may trigger full avalanche breakdown to discharge the ESD current.

The ESD protection device, in accordance with one embodiment of the present invention, avoids creation of a pnpn structure and thus avoids the snapback effect usually experienced with parasitic pnpn devices. No p+ and n+ regions are encompassed within the same n-well or p-well region. Because each n-well (p-well) includes only a p+ region (n− region) no vertical pnp transistors nor lateral npn transistors are formed in the ESD input protection device 300. The back-to-back diodes and their fabrication as p-type regions within an n-well region, form p-n junctions that are used to implement protection against the ESD events.

While the foregoing description has presented particular exemplary embodiments, one skilled in the art will appreciate that alternate embodiments may exist. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An input protection device comprising:
    a first diode having an anode terminal connected to a first pad;
    a second diode having an anode terminal connected to a first node and a cathode terminal connected to a cathode terminal of the first diode;
    a third diode having an anode terminal connected to a second pad;
    a fourth diode having an anode terminal connected to the first node and a cathode terminal connected to a cathode terminal of the third diode;
    a fifth diode having an anode terminal connected to the first node; and
    a sixth diode having an anode terminal connected to a ground node and a cathode terminal connected to a cathode terminal of the fifth diode, said first node not being a ground node.

* * * * *